US006781159B2

(12) United States Patent
Romano et al.

(10) Patent No.: US 6,781,159 B2
(45) Date of Patent: Aug. 24, 2004

(54) FIELD EMISSION DISPLAY DEVICE

(75) Inventors: Linda T. Romano, Sunnyvale, CA (US); David K. Biegelsen, Portola Valley, CA (US)

(73) Assignee: Xerox Corporation, Stamford, CT (US)

( * ) Notice: Subject to any disclaimer, the term of this patent is extended or adjusted under 35 U.S.C. 154(b) by 107 days.

(21) Appl. No.: 09/998,334

(22) Filed: Dec. 3, 2001

(65) Prior Publication Data

US 2003/0102476 A1 Jun. 5, 2003

(51) Int. Cl.[7] .................................................. H01L 33/00

(52) U.S. Cl. ............................. 257/95; 257/13; 257/14; 257/17; 438/20

(58) Field of Search .............................. 257/95, 13, 14, 257/17, 20, 79; 438/20; 313/309, 310, 336, 351, 495

(56) References Cited

U.S. PATENT DOCUMENTS

| | | | | | |
|---|---|---|---|---|---|
| 3,805,601 | A | | 4/1974 | Jeffers | 73/88.5 |
| 3,922,475 | A | | 11/1975 | Manasevit | 428/539 |
| 5,201,992 | A | * | 4/1993 | Andreadakis et al. | 156/643 |
| 5,362,972 | A | * | 11/1994 | Yazawa et al. | 257/13 |
| 5,394,006 | A | | 2/1995 | Lin | 257/506 |
| 5,583,393 | A | * | 12/1996 | Jones | 313/495 |
| 5,628,659 | A | * | 5/1997 | Xie et al. | 445/3 |
| 5,684,319 | A | | 11/1997 | Hebert | 257/336 |
| 5,825,122 | A | * | 10/1998 | Givargizov et al. | 313/336 |
| 6,165,808 | A | | 12/2000 | Zhang | 438/20 |
| 6,417,016 | B1 | * | 7/2002 | Gilton et al. | 438/20 |

OTHER PUBLICATIONS

Kazawa, T. et al., "Fabrication of GaN Field Emitter Arrays by Selective Area Growth Technique", J. Vac. Sol. Tochnol. B 16(2), Mar./Apr. 1998, 833–834.

Youtsey, C. et al., "Gallium Nitride Whiskers Formed by Selective Photoenhanced Wet Etching of Dislocations", Applied Physics Letters, vol. 73, No. 6, Aug. 10, 1998, 797–799.

C. Youtsey, L.T. Romano, I. Adesida, "Gallium Nitride Whiskers Formed by Selective Photoenhanced Wet Etching of Dislocations," *Applied Physics Letters*, vol. 73, No. 6, Aug. 10, 1998, pp. 797–799.

T. Kozawa, M. Suzuki, V. Taga, Y. Gotoh, J. Ishikawa, "Fabrication of GaN Field Emitter Arrays by Selective Area Growth Technique," J. Vac. Sci. Tochnol. B 16(2), Mar./Apr. 1998, pp. 833–835.

* cited by examiner

*Primary Examiner*—Nathan J. Flynn
*Assistant Examiner*—Remmon R. Fordé
(74) *Attorney, Agent, or Firm*—Kent Chen

(57) ABSTRACT

An improved nanotip structure and method for forming the nanotip structure and a display system using the improved nanotip structure is described. The described nanotip is formed from a semiconductor having a crystalline structure such as gallium nitride. The crystalline structure preferably forms dislocations oriented in the direction of the nanotips. One method of forming the nanotip structure uses the relatively slow etching rates that occur around the dislocations compared to the faster etch rates that occur in other parts of the semiconductor structure. The slower etching around dislocations enables the formation of relatively high aspect ratio nanotips in the dislocation area.

19 Claims, 5 Drawing Sheets

FIELD EMISSION DISPLAY DEVICE

STATEMENT OF RELATED APPLICATION

This application is related to U.S. patent application 09/998,294 entitled "Improved Nanotip Structure Formed From Dislocations in a Material" and U.S. patent application 09/998,338 entitled "Method for Fabricating GaN Field Emitter Arrays", both filed on Dec. 3, 2001 and assigned to the earns assignee.

BACKGROUND OF THE INVENTION

Advances in semiconductor technology have succeeded in reducing the size of and driving down the cost of portable electronic devices to the point that display devices have become a limiting factor in the development of inexpensive and reliable portable devices. Today, most portable systems and laptop computers utilize Active Matrix Liquid Crystal technology for the display. However, such displays have several shortcomings. The most notable of these are limited viewing angles, high cost and high power consumption compared to the portable system's other semiconductor electronics. Cathode Ray Tube (CRT) Technology which has been used for larger computer systems enjoys some advantages over liquid crystal systems such as wide viewing angles. However CRT's have been too bulky for integration into portable devices and also require significant amounts of power for operation.

Field Emission Display (FED) technology has been proposed as a display technology that enjoys the advantages of allowing for wide viewing angles as well as being thin and light weight. Field emission displays utilize cold electron emitters called nanotips to eject electrons onto a luminescent surface, typically a phosphor surface such as those found on CRTs. Thus the viewing surface of the FED enjoys many of the advantages, including wide viewing angle of CRTs. Using nanotips rather then an electron gun tube as an electron source significantly reduces power consumption of the display device. The use of nanotip electron sources also reduces the form factor of the display. Electrons ejected from the nanotip typically propagate through a vacuum space within the display toward the nearby luminescent surface. When the electrons impact the luminescent surface, light is emitted. A driving circuit controls the pattern displayed by controlling the nanotip emission of electrons.

One problem with such field emission devices is that the fabrication of nanotips is expensive and difficult. Furthermore, the large size of current nanotips requires higher voltages for operation of the FED than is desirable. Thus, an improved method of forming small nanotips is needed.

BRIEF SUMMARY OF THE INVENTION

The present invention relates to an improved nanotip and an improved method of forming the nanotip. The nanotip is formed from a defect or dislocation in a semiconductor material. The dislocation forms in a direction preferably perpendicular to the interface of the semiconductor and a substrate. The dislocation is selectively etched to produce a nanotip which is subsequently used as an electron source.

DETAILED DESCRIPTION OF THE INVENTION

Figure 1:
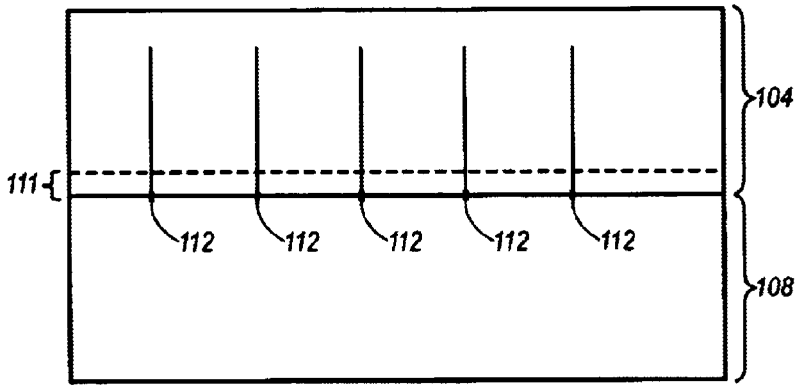
FIG. 1 shows a cross section of a GaN substrate deposited on a substrate including the resulting dislocations.

An improved display device using Field emitter arrays is described. FIG. 1 shows an intermediate structure used to form an improved field effect display. In FIG. 1, a semiconductor material 104 is grown on a substrate 108. In one embodiment, the semiconductor material is gallium nitride (GaN) which is heteroepitaxially grown on a substrate 108 such as sapphire.

Substrate 108 and semiconductor material 104 are selected such that the difference in lattice constants of substrate 108 and of the semiconductor material 104 produce dislocations 112 at the substrate and semiconductor material interface. Generally, lattice constants define the equilibrium spacing of atoms in a material. When a thin layer of a second material with a second lattice constant is grown heteroepitaxially on a first material with a first, different lattice constant, defects are usually induced in the lattice of the second material. At the start of heteroepitaxy of the second material the lattice constants in the second material grows with increasing stress because the bond lengths are constrained to match those of the first material. To accommodate the stresses induced in the second material's atomic bonds, bond arrangements occur periodically which deviate from the bulk structure of the second material. These deviant bond arrangements reduce the induced strain and produce localized defects in the growing film.

Dislocations that result in a defect structure oriented perpendicular to the semiconductor and substrate interface are ideal for forming nanotips. GaN grown on a sapphire substrate forms such dislocations. In particular, when GaN is heteroepitaxially grown on a sapphire substrate, the hexagonal crystalline structure of the GaN mates with the hexagonally symmetric crystalline structure of the sapphire to form defects with a column structure oriented perpendicular to the interface of the GaN and sapphire interface.

Besides its hexagonal crystalline structure which facilitates the production of sharp narrow tips that are desirable in cold cathode applications, GaN is also ideal because GaN forms atom bonds that are stable at high temperatures. High temperature stability is important in cold cathode electron beam source applications that utilize high current densities. One such application is sourcing high flux electron beams in vacuum systems for various uses.

The thickness of the GaN defect column structure can be generally controlled by controlling the thickness of a low temperature buffer layer 111 of GaN from which the defects will be formed. In one embodiment, the temperature during formation of the buffer layer is set to approximately 550 degrees centigrade. The thickness of the buffer layer may vary, but typically is maintained at less than 50 nanometers, and more typically between 20 and 30 nanometers. Layers substantially thinner than 20 nanometers may result in an uneven buffer layer.

Although the present embodiment describes a hexagonal semiconductor grown on a hexagonally symmetric crystalline substrate, other structures may be used to form defects perpendicular to the semiconductor-substrate interface. For example, cubic structures may be forced into such a geometry by forming strained layers or using overgrowth methods to obtain straight perpendicular dislocations.

In a preferred embodiment, the density of dislocations 112 is selected to approximate a desired density of electron emitters. High electron emitter density allows for higher pixel resolution, higher emission currents and display brightness, and more control over emitter sources. The dislocation density can be controlled by controlling the formation of dislocations in the buffer layer, typically by controlling the temperature in the buffer layer. When heteroepitaxial growth is used to grow a GaN layer over a sapphire substrate, a low temperature buffer layer is grown at temperatures below 600 degrees Centigrade followed by a high temperature layer grown at temperatures above the temperature used to grow the buffer layer. This growth enables dislocation densities exceeding $10^{10}$ per square centimeter to be achieved.

After deposition of semiconductor material 104, the semiconductor is etched. Etching techniques are selected that rapidly etch areas that are not dislocated and slowly etch regions around dislocations. One example of such an etching technique is photo-enhanced wet etching of GaN in KOH/$H_2O$. (potassium hydroxide diluted in deionized water) Such etching techniques are described in C. Youtsey, L. T. Romano, I Adesida, Gallium Nitride Whiskers Formed by Selective Photoenhanced Wet Etching of Dislocations, Appl. Phys. Lett, 73, 797 (1998) which is hereby incorporated by reference. The result is high aspect ratio nanotips 116 shown in FIG. 2. In the illustrated embodiment, the nanotips are typically chosen to be from 1 to 3 microns high (the actual height depends on the chosen thickness of layer 104), with a radius of curvature at the tip on the order of 5 nanometers. The tips themselves are preferably atomically sharp to facilitate the ejection of electrons. In the illustrated embodiment, the aspect ratio of the nanotips is approximately 40. Using the techniques outlined in FIG. 4 and the accompanying description will allow the fabrication of nanotips with radiuses typically on the order of 10 nm. The spacing 122 between nanotips varies with the dislocation density, however one micron spacing between nanotips has been achieved.

Increasing the conductivity of the nanotip reduces the electric fields that are needed to eject electrons from a nanotip. A highly conductive nanotip may be achieved by fabricating the nanotip from a highly doped semiconductor, typically an N-type dopant to increase the semiconductor conductivity. For example, when fabricating nanotips from GaN, the GaN may be heavily doped with silicon at levels such as $10^{19}$ atoms per cubic centimeter. An alternative method of raising the nanotip conductivity is to coat the nanotips formed from a semiconductor with a metal, preferably a low work function metal such as for examples strontium or cesium. The metal coating can be applied with methods such as sputtering or evaporation prior to the deposition of the first conformal dielectric layer.

Figure 5:
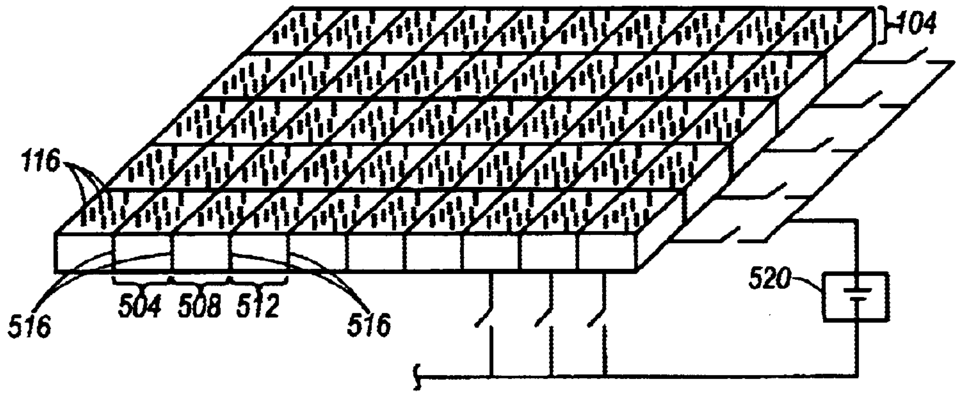
FIG. 5 is a cross section of the bottom portion of a field effect display that shows an array of pixels, each pixel including an array of nanotips.

In a display system, a conductor layer 136 is typically formed in close proximity to the nanotips. An electric field generated by conductor layer 136 helps facilitate the ejection of electrons. In a display system, individual pixels on the display need to be individually addressed to form an image. One method of achieving such addressing is to address all nanotips in common and to segment conductor layer 136 to address individual pixels. Alternately, the conductor layer 136 that accelerates electrons can be continuous and the nanotips can be addressed in clusters as shown in FIG. 5. FIG. 5 shows the bottom portion, the nanotip portion, of the FED. Each cluster of nanotips corresponds to a pixel such as pixels 504, 508, 512. One method of creating addressable clusters is to grow the nanotips over an epitaxially grown p-n junction well that is isolated from neighboring wells. The nanotips over a particular well then form a cluster corresponding to a pixel. Electrical isolation of each cluster may be achieved by a variety of techniques including either etching or ion implantation to create high resistance blocking walls 516 between wells. Each well can be individually activated by a driving circuit 520 in a matrix addressing scheme. One or more transistors formed in the GaN can be used to enable the addressing.

After etching, a first conformal dielectric 126 insulator, such as oxide layer, is deposited over etched semiconductor material 104. The growth rate of the first conformal layer is kept very low to avoid voids forming between the dielectric and the sharp edges of the nanotips. The thickness of the first conformal dielectric 126 is typically a fraction of a micron, much less then the heights of nanotips 116 but sufficiently thick to assure complete coverage of the surface of the GaN. After deposition of the first conformal dielectric layer 126, the growth rate of the dielectric may be increased to reduce fabrication time and to add additional insulating material to form a second dielectric layer 130. The second dielectric layer 130 may be either a conformal or a nonconformal layer. Second dielectric layer 130 is typically, though not necessarily, thicker than the height of the nanotips 116 such that the top surface 133 of the second dielectric layer 130 is above the top of each whisker. However, preferably dielectric layer 130 should be thin enough that each nanotip 116 should result in a deformation 132 of a top surface 133 of second dielectric layer 130. Although the process of forming the insulator layer has been subdivided and described as a two step operation using different growth rates of a dielectric material, a single growth rate may be substituted for the two growth rates in a one step process, usually trading off fabrication time for device yield rates.

After formation of insulator layer 130, a thin conductor layer 136, typically a metal, is formed over second insulator layer 130. As previously described, electric fields originating from conductor layer 136 may be used to help eject electrons from the nanotips.

Figure 2:
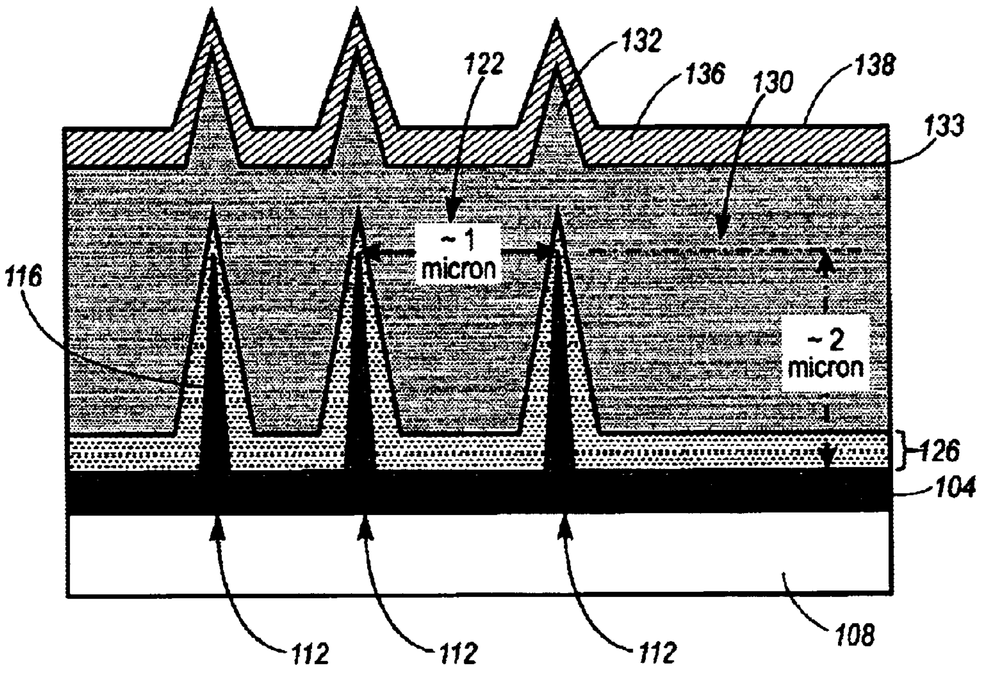
FIG. 2 shows an interim structure including formed nanotips used to form the field effect display of FIG. 3.
Figure 3:
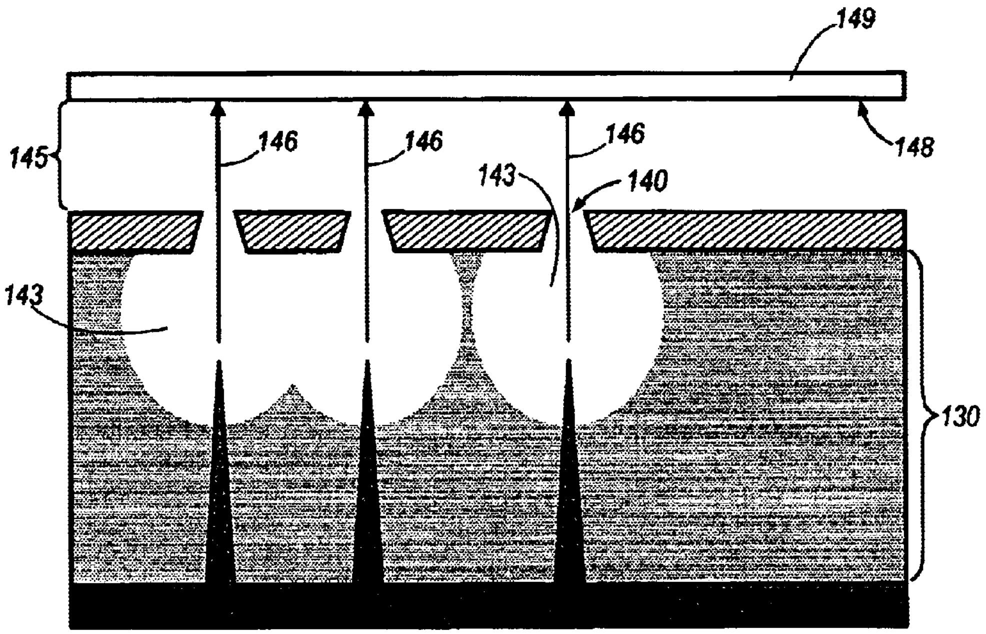
FIG. 3 shows a side view cross section of a pixel of a field effect display that includes an array of nanotips to emit electrons toward a luminescent surface of a FED.

FIG. 3 shows the FED structure after further processing of the structure of FIG. 2. In FIG. 3, the structure of FIG. 2 has been planarized such that deformations 132 of FIG. 2 and corresponding metal deposited over the deformations have been removed. Removing the metal over the deformations leaves openings 140 of FIG. 3 in the metal. The openings allow exposure of the second insulator layer 130 to etching agents.

In an alternate embodiment, the planarization operation may be avoided by depositing the metal using metal evaporation at an angle off the normal. Then the local peak in the dielectric shadows the evaporated metal deposition providing a pinhole in the metal film just off center of the dielectric peak. In principle, no planarization step would be needed to open up etch holes, instead holes in the metal over the nanotips would naturally form. However, the described technique also results in undesirable metal asperities.

After formation of openings in the metal layer that are aligned with the nanotips, isotropic etchants create cavities 143, in the second and first dielectric layers 130 and 126. Separate etchants can be used to tailor the shape of the cavities as needed. Etching can use either wet or dry (plasma) processes.

Etching the dielectric to create cavities undercuts the metal layer. In one embodiment, the depth of the etched cavities is less than the average distance between adjacent nanotips such that sufficient dielectric is left to support the metal layer and keep the metal layer attached to the dielectric. However, when the depth of the cavities exceeds the distance between adjacent nanotips, the metal layer can be significantly undercut. Under such circumstances, additional anchors may be needed to support the metal layer over the dielectric.

One method of forming such anchors is to pattern dielectric layers 126, 130 prior to deposition of metal forming conducting layer 136. In such an operation, a resist layer is deposited over the dielectric layer. The resist layer is masked to form etch holes in the resist. The ideal spacing of the etch holes is partially dependent on the thickness of the metal layer that will be supported by the anchors. Because anchors are only useful when the conducting layer will be totally undercut by the etching process leaving only anchors to support the conducting layer, the conducting layer should be strong enough to support itself between anchors. When a metal layer is used for conducting layer 136, a typical spacing of anchor supports might be ten times the thickness of the metal layer.

The etch holes are used to etch anchor holes in the dielectric layer. The anchor holes may extend down to the crystalline material, typically GaN. The anchor holes are then filled with an anchoring material such as a polyimide material or another anchoring material that is not etched by the etchant subsequently used to create cavities in the dielectric material.

After deposition of the anchoring material into the anchor holes, the resist layer is removed and the metal layer deposited. The metal layer bonds to the anchoring material such that when the cavities are etched, the anchoring material maintains the metal layer over the dielectric layer.

Electric fields between conductor layer 136 and nanotips 116 cause ejection of electrons from the top of nanotips 116. These electrons propagate along a travel path such as travel path 146 formed within each cavity 143, as well as within free space area 145. Each travel path 146 extends from the top of a nanotip 116, through a corresponding cavity 143 and free space 145 to a surface 148 that converts electron energy to photon energy. In the illustrated embodiment, surface 148 is a phosphor coated transparent conducting layer 149 on a transparent plate such as glass or plastic. Conducting layer 149 is held at a voltage to provide a field which attracts the emitted electrons from the aperture region.

Figure 4:
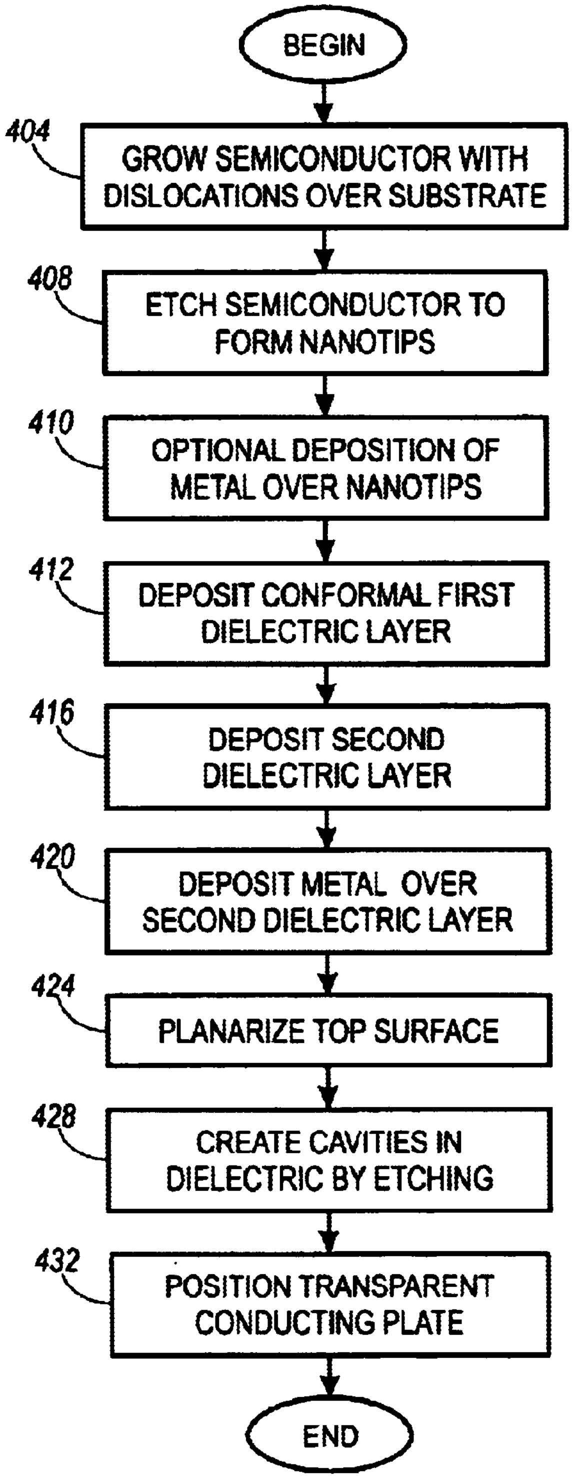
FIG. 4 is a flow diagram that describes the process steps used to form the FED including the formation of the nanotips.

FIG. 4 is a flow chart that describes one method of forming the nanotip. In block 404, a semiconductor layer, typically with a hexagonal crystalline structure such as Gallium Nitride (GaN), is grown over a base substrate. The base substrate, overlayer and growth conditions are selected based on the number of dislocations desired. Each dislocation will eventually be used to produce a microtip. The growth rate of the GaN semiconductor is carefully controlled such that a uniform distribution of dislocations results. One method of achieving controlled growth rates of the hexagonal GaN pixels is using metal organic vapor phase epitaxy (MOVPE). Alternate methods include molecular beam epitaxy and hybrid vapor phase epitaxy (HVPE).

A high density of dislocations enables formation of a high density of nanotips. High nanotip densities are desirable because they allow each pixel to include many nanotips. Each phosphor area corresponding to a pixel is thus subject to electrons from many different nanotips. The high number of nanotips corresponding to each pixel increases the available number of electrons or current per pixel and thus produces a brighter pixel at a given voltage. The high number of nanotips also provides a more statistically uniform emission from pixel to pixel.

Current display systems typically have pixel dimensions of approximately 100 by 100 micrometer. Standard Spindt processes utilize photolithography to pattern apertures which are used as shadow masks for tip growth. However, such photolithographic features are limited to ~1 micron. Therefore, this process of forming nanotips has been limited to yielding approximately $10^8$ nanotips per square centimeter. When applied to 100×100 micrometer pixels, $10^8$ nanotips per square centimeter (which is 1 nanotip per square micron) yields approximately 10,000 nanotips per pixel. By performing a heteroepitaxial growth of GaN on a sapphire substrate, dislocation densities as high as $10^{10}$ dislocations per square centimeter have been achieved. A $10^{10}$ dislocation per square centimeter dislocation density would increase the number of nanotips per pixel by a factor of approximately 100. The hundred time increase in nanotip density increases potential current densities by approximately 100 and decreases current variation from pixel to pixel by approximately 10 times. The described method also eliminates the need for an aperture definition mask step.

After the hexagonal crystalline semiconductor is grown over the substrate, the semiconductor is etched in box 408. It has been discovered that photo-enhanced wet etching of GaN in $KOH/H_2O$ results in very slow etching of material around dislocations and rapid etching of undislocated material. One effective etching technique uses a mercury lamp and a low concentration KOH solution in a process described in C. Youtsey, L. T. Romano, I Adesida, Appl. Phys. Lett, 73, 797 (1998). The result of the etching is very high aspect ratio "nanotips" that are normal to the substrate surface. In one embodiment, the nanotips are spaced approximately 100 nm apart.

Typically, the semiconductor nanotips are formed from a heavily doped semiconductor to maintain a high conductivity of the nanotips. Alternately, the nanotips may be coated with a metal layer as shown in block 410. The metal is preferably a low work function metal that allows electrons to be easily ejected from the metal when exposed to relatively low electric field levels.

After formation of the GaN nanotips, a slow growth conformal dielectric layer is formed over the GaN layer as shown in block 412. The slow growth conformal dielectric layer may be formed from a number of materials such as silicon oxide. The oxide may be formed using a number of techniques including wet oxidation, dry oxidation, sputtering or other techniques. The rate of dielectric growth or deposition is kept slow enough to avoid the formation of voids between the conformal dielectric layer and the nanotip surface.

In one embodiment, after deposition of the first conformal oxide layer, the remainder of the dielectric layer is deposited in block 416. The remainder of the dielectric layer or "second" dielectric layer may be formed at a higher deposition rate to reduce fabrication time. The risks of void formation in the remainder dielectric layer are reduced because the slow growth rate conformal dielectric layer has smoothed the sharp edges of the nanotips reducing the probability of void formation. Furthermore, because the nanotips have already been sealed by the slow growth dielectric layer, the formation of small voids in the remainder dielectric layer can be tolerated. Alternately, the entire first and second dielectric layer may be formed in a single operation, usually involving some compromise in either fabrication speed by using a slower growth rate throughout the fabrication of the insulator layer or increased failure rates due to occasional voids caused by faster growth rates. The thickness of the combined slow growth and remainder dielectric layers should be thick enough such that the a planar top surface of the second dielectric layer is above a top of each nanotip, but thin enough that the nanotips cause a nonplanarity of the top surface as shown in FIG. 2.

In block 420, a conducting layer, typically a metal, is deposited over the second dielectric layer. In one embodiment, the conducting layer is between 100 nm and 300 nm thick. Each nanotip causes a corresponding deformation 132 or protruding region of conducting layer 136 as shown in FIG. 2.

In block 424, the wafer is planarized to remove each protruding region of the conducting layer. The planarization may be achieved using either chemo-mechanical polishing or electro-polishing in such a way as to stop near the top of the metal planar surface 138 of FIG. 2. The removed region leaves openings in the conducting layer.

In block 428, a portion of the dielectric directly underneath the openings in the conducting layer is removed. Removal of the dielectric creates cavities such as cavity 143 of FIG. 3. The removal process exposes the tops of the nanotips. One method of etching the dielectric without damaging GaN nanotips is to use a wet, isotropic etch that dissolves away the dielectric. The etch exposes the free tips in close proximity to modulation electrodes. Thus the modulation electrodes are automatically "self-aligned" with the free tips.

In block 432, a phosphor-coated transparent conducting plate 149 of FIG. 3 is positioned above metal conducting layer 136. The phosphor covered side of conducting plate 149 is positioned over the holes in the conducting layer. To minimize deflection of electrons by air particles, the region between the phosphorcoated transparent conducting plate and the GaN nanotips may be pumped free of air to create a vacuum and then the region sealed off. The use of a vacuum in the region helps minimize deflections of electrons that travel from the nanotips to the phosphorcoated transparent conducting plate, however such a vacuum is not required for display operation.

During operation as a display, the transparent conducting plate is voltage biased to receive electrons which are extracted from the end of the nanotips by the field induced by the conducting layer 136. Layer 149 induces an electric field that attracts the extracted electrons drawing the electrons through the aperture. A driving circuit controls the voltage differential between the conducting plate and the nanotip. In most embodiments, the driving circuit maintains the transparent phosphor covered surface and conducting layer 136 at constant potentials and varies the voltage at the nanotips.

The voltage needed to cause ejection of electrons from the nanotips depends in large part on the radii of curvature of the nanotips. Smaller nanotips with more irregular surfaces concentrate electric field strength resulting in ejection of electrons at lower voltages. Because lower operating voltages are desirable, formation of small radii tips is a desired characteristic. In traditional systems, tip radii frequently exceed 100 nanometers necessitating high field strengths approximately ranging from 100–195 volts per micrometer to eject electrons from the micro-tips. Using the methods described herein, experimental nanotips have been formed that have tip radii less than 10 nanometers.

During operation, each nanotip serves as a source of electrons. When the voltage difference between the nanotip and the conducting layer 136 exceeds a threshold value electrons are ejected from the microtips and accelerated through the aperture, and towards the phosphor-coated conducting layer 149. As ejected electrons strike the phosphor-coated surface, light is emitted. The pattern of voltages applied to the array of nanotips is thus translated into a light pattern or image for viewing.

The preceding discussion includes details such as process parameters, dimensions, and structure designs. These details have been provided to facilitate understanding of the ideal operating parameters of the subject invention. However, such details should not be considered limiting, as numerous changes and modifications would be obvious to those of ordinary skill in the art. Thus the scope of the invention should only be limited by the claims which follow.

What is claimed is:

1. An improved field display device comprising:

an array of nanotips formed from an array of defects in a crystalline material; and a transparent plate positioned over the array of nanotips, the transparent plate to produce light when receiving electron emissions from the nanotips.

2. The improved display device of claim 1 wherein each defect in the array of defects forms a column structure oriented in a direction perpendicular to a plane formed by an interface between the crystalline material and a substrate.

3. The improved field display device of claim 1 wherein the crystalline material is a hexagonal crystalline material.

4. The improved field display device of claim 3 wherein the hexagonal crystalline material is a semiconductor.

5. The improved field display device of claim 4 wherein the semiconductor is Gallium Nitride.

6. The improved field display device of claim 1 wherein the nanotips are coated with a metal.

7. The improved field display device of claim 6 wherein the metal is a low work function metal.

8. The improved field display device of claim 4 wherein the semiconductor is a highly doped semiconductor.

9. The improved display device of claim 1 further comprising:

a substrate, wherein the formation of the crystalline material over the substrate induces a homogeneous array of dislocations to form said array of defects.

10. The improved display device of claim 9 wherein the nanotips are formed by etching the crystalline material leaving nanotips at the site of each defect in the array of defects.

11. The improved display device of claim 1 further comprising:

a conformal dielectric layer formed over the crystalline material.

12. The improved display device of claim 1 wherein the transparent plate is a glass sheet.

13. The improved display device of claim 1 further comprising;

electrical contacts coupled to the nanotips to allow a driver circuit to apply a voltage to each nanotip, the voltage high enough to cause the ejection of electrons from each nanotip.

14. The improved display device of claim 1 further comprising:

a hexagonally symmetric crystalline substrate, wherein the crystalline material is a hexagonal crystalline material such that the growth of the crystalline material upon the hexagonally symmetric crystalline substrate results in defects perpendicular to the crystalline material and crystalline substrate interface.

15. The improved display device of claim 14 wherein the crystalline substrate is sapphire substrate.

16. The improved display device of claim 15 wherein the crystalline material is Gallium nitride.

17. The improved display device of claim 2 wherein each column structure of defects positioned along an approximate center of a corresponding nanotip.

18. The improved display device of claim 1 wherein the defects are dislocations.

19. An improved field display device comprising:

a substrate;

an array of crystalline nanotips formed over the substrate, each crystalline nanotip in the array of crystalline nanotips surrounding a corresponding column of dislocation defects; and, a transparent plate positioned over the array of nanotips, the transparent plate to produce light when receiving electron emissions from the nanotips.

* * * * *